United States Patent
Mulder

(10) Patent No.: US 8,253,470 B2
(45) Date of Patent: Aug. 28, 2012

(54) OFFSET CALIBRATION FOR AMPLIFIERS

(75) Inventor: Jan Mulder, Houten (NL)

(73) Assignee: Broadcom Corporation, Irvine, CA (US)

( * ) Notice: Subject to any disclaimer, the term of this patent is extended or adjusted under 35 U.S.C. 154(b) by 95 days.

(21) Appl. No.: 12/881,434

(22) Filed: Sep. 14, 2010

(65) Prior Publication Data

US 2012/0032722 A1 Feb. 9, 2012

Related U.S. Application Data

(60) Provisional application No. 61/370,536, filed on Aug. 4, 2010.

(51) Int. Cl.
*H03L 5/00* (2006.01)
(52) U.S. Cl. .............................. 327/307; 327/306; 330/9
(58) Field of Classification Search .................. 327/306, 327/307; 330/9
See application file for complete search history.

(56) References Cited

U.S. PATENT DOCUMENTS

2006/0098271 A1 * 5/2006 Koller et al. .................. 359/337

OTHER PUBLICATIONS

Mangelsdorf et al.,"A two-residue architecture for multistage ADCs," *ISSCC Dig. of Tech. Papers*, pp. 64-65, Feb. 1993.
Van der Ploeg et al.,"A 3.3-V, 10-b, 250MSample/s two-step ADC in 0.35-μm CMOS," *IEEE Journal of Solid-State Circuits*, 34(12):1803-1811, Dec. 1999.
Van der Ploeg et al.,"A 2.5-V 12-b 54-Msample/s 0.25-μm CMOS ADC in 1-mm² with mixed-signal chopping and calibration," *IEEE Journal of Solid-State Circuits*, 36(12):1859-1867, Dec. 2001.

* cited by examiner

*Primary Examiner* — John Poos
(74) *Attorney, Agent, or Firm* — Sterne, Kessler, Goldstein & Fox PLLC

(57) ABSTRACT

An apparatus, a method, and a system are provided to calibrate an offset in an amplifier. The apparatus can include an amplifier, a voltage control unit, a comparator, and a processing unit. The amplifier can have four terminals: a positive differential input ($V_{IN}^+$), a negative differential input ($V_{IN}^-$), a positive differential output ($V_{OUT}^+$), and a negative differential output ($V_{OUT}^-$). The voltage control unit can be configured to adjust a first voltage on $V_{OUT}^+$ and a second voltage on $V_{OUT}^-$. The comparator can be configured to compare the first voltage on $V_{OUT}^+$ to the second voltage on $V_{OUT}^-$ when $V_{IN}^+$ and $V_{IN}^-$ are coupled to a common voltage. Further, the processing unit can be configured to provide a control signal to the voltage control unit based on the comparison of the first and second voltages on $V_{OUT}^+$ and $V_{OUT}^-$, respectively.

20 Claims, 7 Drawing Sheets

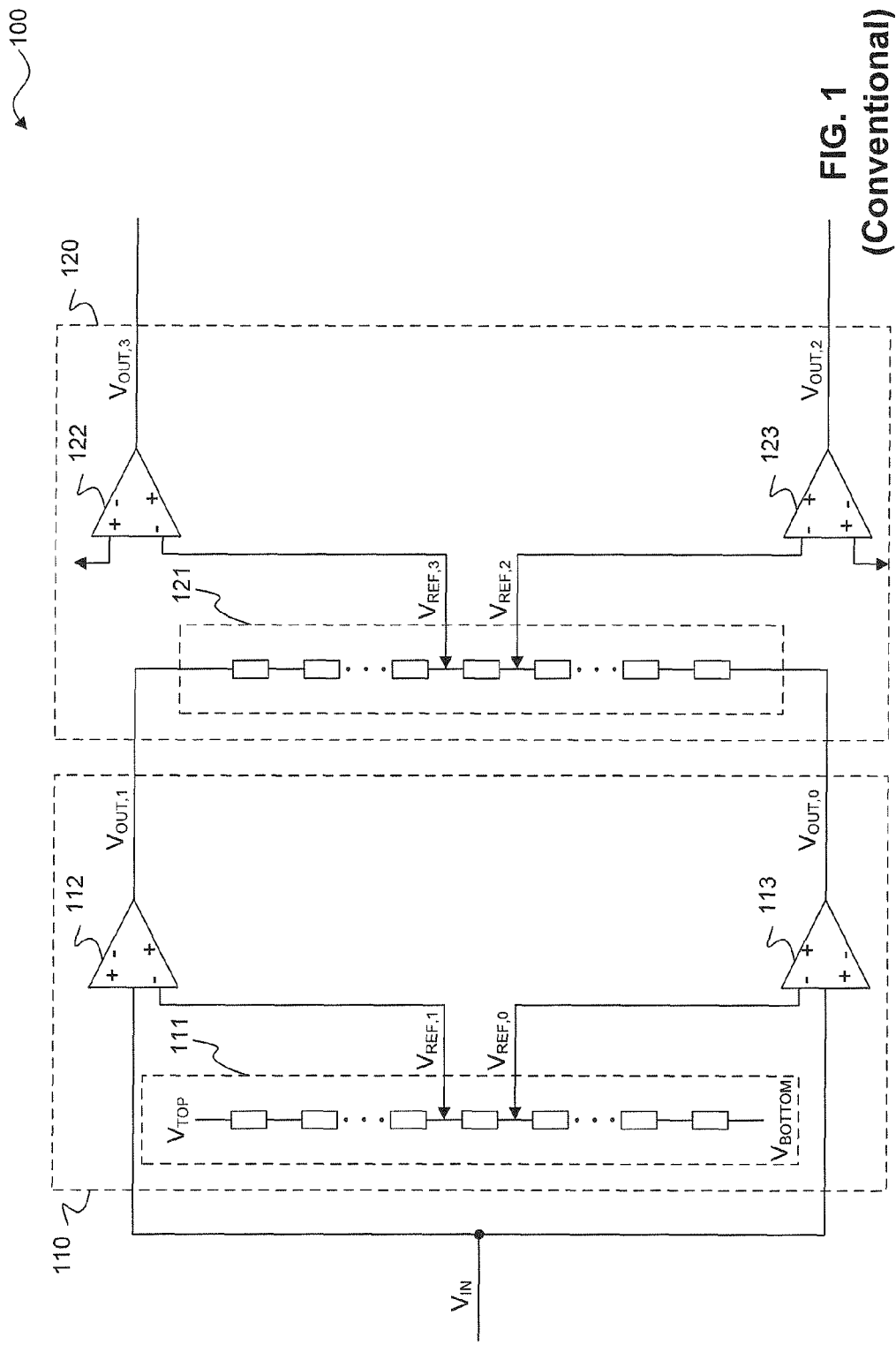
FIG. 1 (Conventional)

OFFSET CALIBRATION FOR AMPLIFIERS

CROSS REFERENCE TO RELATED APPLICATION

This application claims the benefit of U.S. Provisional Application No. 61/370,536, filed Aug. 4, 2010, titled "Offset Calibration for Amplifiers," which is incorporated herein by reference in its entirety.

BACKGROUND

1. Field

The present invention generally relates to the field of offset calibration for amplifiers.

2. Background

Analog-to-digital converters (ADCs) convert an analog input signal into a corresponding digital output signal. ADCs are implemented in many electronic applications such as, for example, quadrature amplitude modulation applications, digital televisions, and imaging applications. Oftentimes, ADCs are embedded in integrated circuits with stringent area and power requirements. It is thus desirable to avoid the need to trim the ADCs to achieve a required accuracy, as the process of trimming the ADC typically involves additional integrated circuits that occupy area and consume power.

However, in many ADC implementations, the matching of active devices oftentimes plays a significant factor in the accuracy of the ADC. For instance, mismatch in active devices of an amplifier used in the ADC can produce a DC offset, which can play a significant factor in the accuracy of the ADC. To increase accuracy in the ADC, the circuit area of the active devices in the amplifier (e.g., transistors that receive inputs to the amplifier) may be significantly increased (e.g., by 4 times) to achieve higher ADC resolution. This, in turn, can lead to low speeds and/or high power consumption by the amplifier. A tradeoff therefore exists between accuracy of the ADC and circuit area, speed, and power consumption of the ADC.

Apparatuses, methods, and systems are needed for calibrating offsets in amplifiers to achieve a high-resolution ADC, while minimizing circuit area and power consumption of the ADC.

SUMMARY

Embodiments include an offset calibration apparatus. The offset calibration apparatus can include an amplifier, a voltage control unit, a comparator, and a processing unit. The amplifier can have the following terminals: a positive differential input ($V_{IN}^+$), a negative differential input ($V_{IN}^-$), a positive differential output ($V_{OUT}^+$), and a negative differential output ($V_{OUT}^-$). The voltage control unit can be configured to adjust a first voltage on $V_{OUT}^+$ and a second voltage on $V_{OUT}^-$. The comparator can be configured to compare the first voltage on $V_{OUT}^+$ to the second voltage on $V_{OUT}^-$ when $V_{IN}^+$ and $V_{IN}^-$ are coupled to a common voltage. Further, the processing unit can be configured to provide a control signal to the voltage control unit based on the comparison of the first and second voltages on $V_{OUT}^+$ and $V_{OUT}^-$, respectively, where the voltage control unit adjusts, based on the control signal, the first and second voltages on $V_{OUT}^+$ and $V_{OUT}^-$, respectively, to produce a predetermined comparator output.

The offset calibration apparatus can also include a first switch, a second switch, and a third switch. The first switch can be configured to couple $V_{IN}^+$ to $V_{IN}^-$ during an offset calibration mode of operation and to disconnect $V_{IN}^+$ from $V_{IN}^-$ during an amplification mode of operation, where the amplifier is configured to amplify a voltage difference between $V_{IN}^+$ and $V_{IN}^-$ during the amplification mode of operation. The second switch can be configured to couple $V_{OUT}^+$ to a first input terminal of the comparator during the offset calibration mode of operation and to disconnect $V_{OUT}^+$ from the first input terminal of the comparator during the amplification mode of operation. Further, the third switch can be configured to couple $V_{OUT}^-$ to a second input terminal of the comparator during the offset calibration mode of operation and to disconnect $V_{OUT}^-$ from the second input terminal of the comparator during the amplification mode of operation.

Embodiments additionally include a method for calibrating an offset in an amplifier. The method can include the following: comparing, with a comparator, a first voltage on a positive differential output ($V_{OUT}^+$) to a second voltage on a negative differential output ($V_{OUT}^-$) of an amplifier when a positive differential input ($V_{IN}^+$) is coupled to a negative differential input ($V_{IN}^-$) of the amplifier; monitoring the comparison of the first voltage on $V_{OUT}^+$ to the second voltage on $V_{OUT}^-$ to provide a control signal to a voltage control unit based on the comparison; and, adjusting, based on the control signal, at least one of the first voltage on the $V_{OUT}^+$ and the second voltage on the $V_{OUT}^-$ such that the first and second voltages on $V_{OUT}^+$ and $V_{OUT}^-$, respectively, produce a predetermined comparator output.

Embodiments further include a system to calibrate an offset in one or more residue amplifiers in a dual-residue analog-to-digital converter (ADC). The system can include a reference ladder, a first amplifier, a second amplifier, and an offset calibration circuit. The first amplifier can be configured to receive an input voltage ($V_{IN}$) at a first positive differential input ($V_{IN1}^+$) and a first reference voltage ($V_{REF1}$) at a first negative differential input ($V_{IN1}^-$) from the reference ladder and to produce a first positive differential output ($V_{OUT1}^+$) and a first negative differential output ($V_{OUT1}^-$). The second amplifier can be configured to receive $V_{IN}$ at a second positive differential input ($V_{IN2}^+$) and a second reference voltage ($V_{REF2}$) at a second negative differential input ($V_{IN2}^-$) from the reference ladder and to produce a second positive differential output $V_{OUT2}^+$ and a second negative differential output $V_{OUT2}^-$.

The offset calibration circuit can include a comparator, a first voltage control unit, a second voltage control unit, and a processing unit. The comparator can be configured to perform the following functions: compare the voltage on $V_{OUT1}^+$ to the voltage on $V_{OUT1}^-$ when $V_{IN1}^+$ and $V_{IN1}^-$ are coupled to a common voltage; and, compare the voltage on $V_{OUT2}^+$ to the voltage on $V_{OUT2}^-$ when $V_{IN2}^+$ and $V_{IN2}^-$ are coupled to a common voltage. The first voltage control unit can be configured to adjust a first voltage on $V_{OUT1}^+$ and a second voltage on $V_{OUT1}^-$. The second voltage control unit can be configured to adjust a third voltage on $V_{OUT2}^+$ and a fourth voltage on $V_{OUT2}^-$.

Further, the processing unit can be configured to perform various functions. For instance, the processing unit can provide a first control signal to the first voltage control unit based on the comparison of the voltages on $V_{OUT1}^+$ and $V_{OUT1}^-$. Here, the first voltage control unit adjusts, based on the first control signal, the first and second voltages on $V_{OUT1}^+$ and $V_{OUT1}^-$, respectively, to produce a first predetermined comparator output. The processing can also provide a second control signal to the second voltage control unit based on the comparison of the voltages on $V_{OUT2}^+$ and $V_{OUT2}^-$. Here, the second voltage control unit adjusts, based on the second control signal, the third and fourth voltages on $V_{OUT2}^+$ and $V_{OUT2}^-$, respectively, to produce a second predetermined comparator output.

Further features and advantages of the invention, as well as the structure and operation of various embodiments of the present invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art based on the teachings contained herein.

BRIEF DESCRIPTION OF THE DRAWINGS

The accompanying drawings, which are incorporated herein and form a part of the specification, illustrate embodiments of the present invention and, together with the description, further serve to explain the principles of the invention and to enable a person skilled in the relevant art to make and use the invention.

FIG. 1 is an illustration of a conventional dual-residue analog-to-digital converter.

Figure 2:
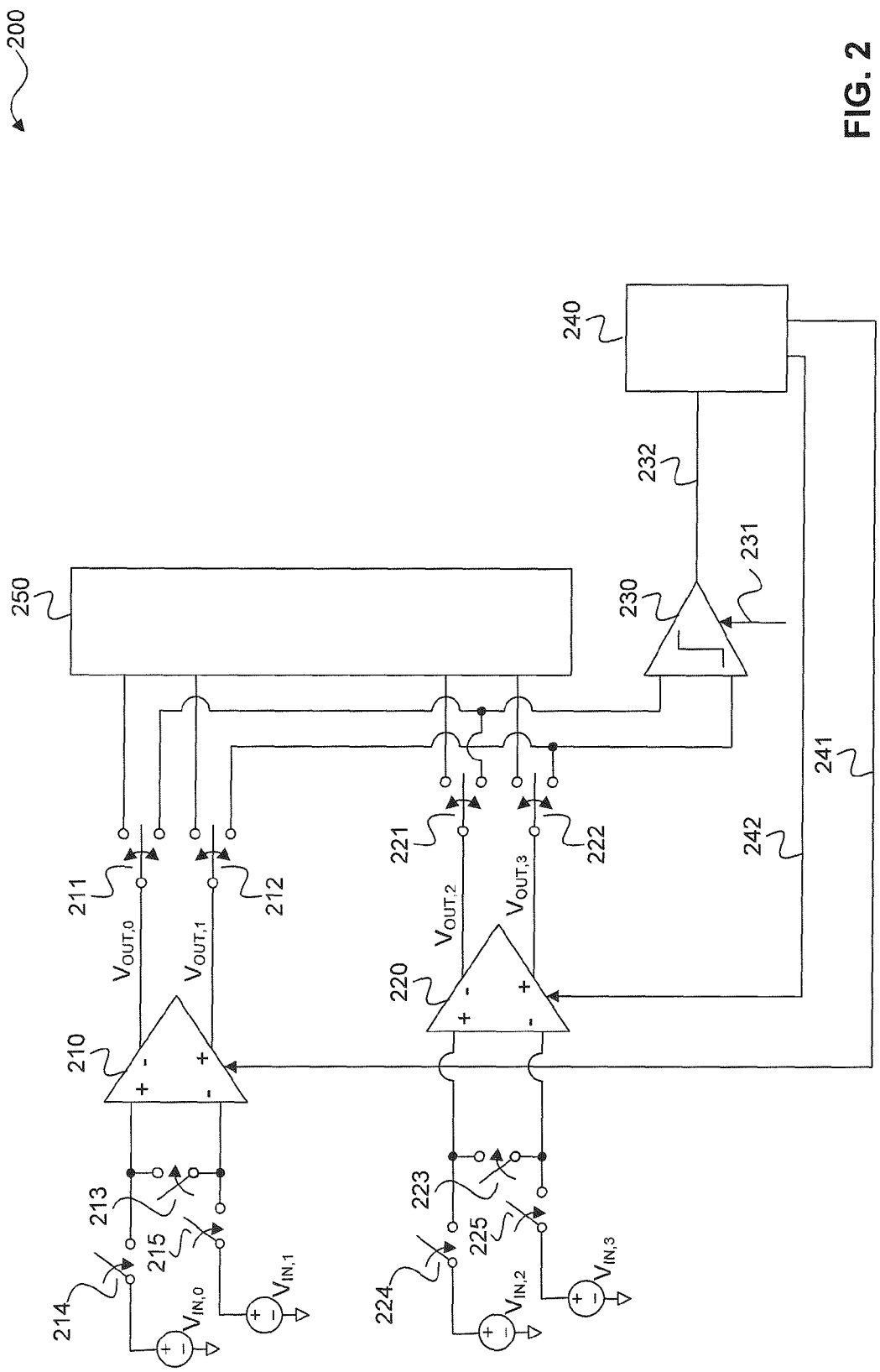
FIG. 2 is an illustration of an embodiment of an offset calibration circuit.

The present invention will now be described with reference to the accompanying drawings. In the drawings, generally, like reference numbers indicate identical or functionally similar elements. Additionally, generally, the left-most digit(s) of a reference number identifies the drawing in which the reference number first appears

DETAILED DESCRIPTION

The following detailed description refers to the accompanying drawings that illustrate exemplary embodiments consistent with this invention. Other embodiments are possible, and modifications can be made to the embodiments within the spirit and scope of the present invention. Therefore, the detailed description is not meant to limit the present invention. Rather, the scope of the present invention is defined by the appended claims.

It would be apparent to a person skilled in the relevant art that the present invention, as described below, can be implemented in many different embodiments of software, hardware, firmware, and/or the entities illustrated in the figures. Any actual software code with the specialized control of hardware to implement embodiments of the present invention is not limiting of the present invention. Thus, the operational behavior of embodiments of the present invention will be described with the understanding that modifications and variations of the embodiments are possible, given the level of detail presented herein.

Further, for purposes of explanation, specific details are set forth in order to provide a thorough understanding of the present invention. It will be evident, however, to a person skilled in the relevant art that the present invention may be practiced without these specific details. In other instances, well-known circuits, structures, and techniques are not shown in detail, but rather in a block diagram in order to avoid unnecessarily obscuring an understanding of this description.

Reference in the description to "one embodiment" or "an embodiment" means that a particular feature, structure, or characteristic described in connection with the embodiment is included in at least one embodiment of the invention. The phrase "in one embodiment" located in various places in this description does not necessarily refer to the same embodiment.

FIG. 1 is an illustration of a conventional dual-residue analog-to-digital converter (ADC) 100 in which embodiments of the present invention can be implemented. Dual-residue ADC 100 includes a first ADC stage 110 and a second ADC stage 120. First ADC stage 110 receives an analog input signal $V_{IN}$ that needs to be converted to a digital signal and also includes a reference ladder 111, a residue amplifier 112, and a residue amplifier 113. Reference ladder 111 can include, for example and without limitation, a series of resistive elements with a voltage $V_{TOP}$ applied to the top of reference ladder 111 and a voltage $V_{BOTTOM}$ applied to the bottom of reference ladder 111, where the voltage $V_{TOP}$ is greater than the voltage $V_{BOTTOM}$. Reference ladder 111 is configured to produce a plurality of reference voltages, in which one or more of the reference voltages can be used for comparison with the analog input signal $V_{IN}$.

A first coarse ADC (CADC), which is not shown in FIG. 1, performs a first quantization of analog input signal $V_{IN}$. Based on an output of the first CADC, two reference voltages are selected from reference ladder 111—one reference voltage $V_{REF,1}$ greater than $V_{IN}$ and another reference voltage $V_{REF,0}$ less than V. Reference voltages $V_{REF,1}$ and $V_{REF,0}$ are subtracted from $V_{IN}$, and the two resulting residue voltages ("dual-residue" voltages), ($V_{IN}-V_{REF,1}$) and ($V_{IN}-V_{REF,0}$), are amplified by residue amplifiers 112 and 113, respectively. The output of residue amplifiers 112 and 113 are denoted as $V_{OUT,1}$ and $V_{OUT,0}$, respectively. Together, with the digital output code of the first ADC, an interpolated "zero-crossing" (x) between $V_{OUT,1}$ and $V_{OUT,0}$ is a measure of the analog input signal $V_{IN}$.

Similar to first ADC stage 110, second ADC stage 120 includes a reference ladder 121, a residue amplifier 122, and a residue amplifier 123. Reference ladder 121 can include, for example and without limitation, a series of resistive elements with the voltage $V_{OUT,1}$ applied to the top of reference ladder 121 and the voltage $V_{OUT,0}$ applied to the bottom of reference ladder 121. A second CADC, which is not shown in FIG. 1, performs a second quantization. The second quantization is performed on interpolated voltages between $V_{OUT,1}$ and $V_{OUT,0}$.

Based on an output of the second CADC, two interpolated voltages closest to the zero-crossing (x) are received as inputs to residue amplifiers 122 and 123 (e.g., $V_{REF,3}$ and $V_{REF,2}$, respectively). Reference voltages $V_{REF,3}$ and $V_{REF,2}$ can be subtracted from ground (i.e., 0V), and the resulting residue voltages, (0–$V_{REF,3}$) and (0–$V_{REF,2}$), can be amplified by residue amplifiers 122 and 123, respectively. The output of residue amplifiers 122 and 123 are denoted as $V_{OUT,3}$ and $V_{OUT,2}$, respectively. An interpolated zero-crossing (x) between $V_{OUT,3}$ and $V_{OUT,2}$ can be used to obtain a more accurate measurement of the analog input signal $V_{IN}$ than the measurement from first ADC stage 110. As would be understood by a person skilled in the relevant art, additional ADC stages can be incorporated into dual-residue ADC 100 to achieve a more accurate measure (or a higher resolution) of the analog input signal $V_{IN}$, in which each of the additional ADC stages operates in a similar manner to ADC stages 110 and 120 described above.

A challenge in achieving an accurate analog-to-digital conversion from dual-residue ADC 100 relates to offsets in residue amplifiers 112, 113, 122, and 123. For instance, a DC offset in residue amplifier 112 and/or residue amplifier 113 can shift the output values $V_{OUT,1}$ and $V_{OUT,0}$, respectively, thus causing a shift in the interpolated zero-crossing (x) between $V_{OUT,1}$ and $V_{OUT,0}$. Consequently, this leads to an inaccurate measurement of the analog input signal $V_{IN}$ from first ADC stage 110. In a similar manner, DC offsets in residue amplifiers 122 and 123 can lead to an inaccurate measurement of the analog input signal $V_{IN}$ from second ADC stage 120.

Embodiments of the present invention compensate for the offsets present in residue amplifiers 112, 113, 122, and 123. For example and without limitation, embodiments of the present invention compensate for DC offsets present in the residue amplifiers. In summary, and as described in further detail below, embodiments of the present invention can compensate for DC offsets in the residue amplifiers during a time period in which the residue amplifiers are not used in the analog-to-digital conversion process described above with respect to FIG. 1. In an embodiment, compensation for DC offsets in the residue amplifiers occur during a time period in which the residue amplifiers are not being used in the amplification portion of the analog-to-digital conversion process.

FIG. 2 is an illustration of an embodiment of an offset calibration circuit 200. Offset calibration circuit 200 includes amplifiers 210 and 220, switches 211-215 and 221-225, a comparator 230, a processing unit 240, and an external circuit 250. In an embodiment, external circuit 250 represents a circuit that receives one or more outputs from amplifiers 210 and 220. External circuit 250 can represent, for example and without limitation, one or more circuit portions of a dual-residue ADC (e.g., dual-residue ADC 100 of FIG. 1). For instance, with respect to dual-residue ADC 100 of FIG. 1, residue amplifiers 112 and 113 can be replaced with amplifiers 210 and 220, respectively. This circuit arrangement is described in further detail below with respect to FIG. 6.

In an embodiment, amplifiers 210 and 220 are fully-differential amplifiers with differential inputs (e.g., $V_{IN}^+$ and $V_{IN}^-$) and differential outputs (e.g., $V_{OUT}^+$ and $V_{OUT}^-$). Based on the description herein, a person skilled in the relevant art will recognize that other types of amplifiers can be used in the embodiments described herein. These other types of amplifiers are within the scope and spirit of the embodiments of the present invention.

Figure 3:
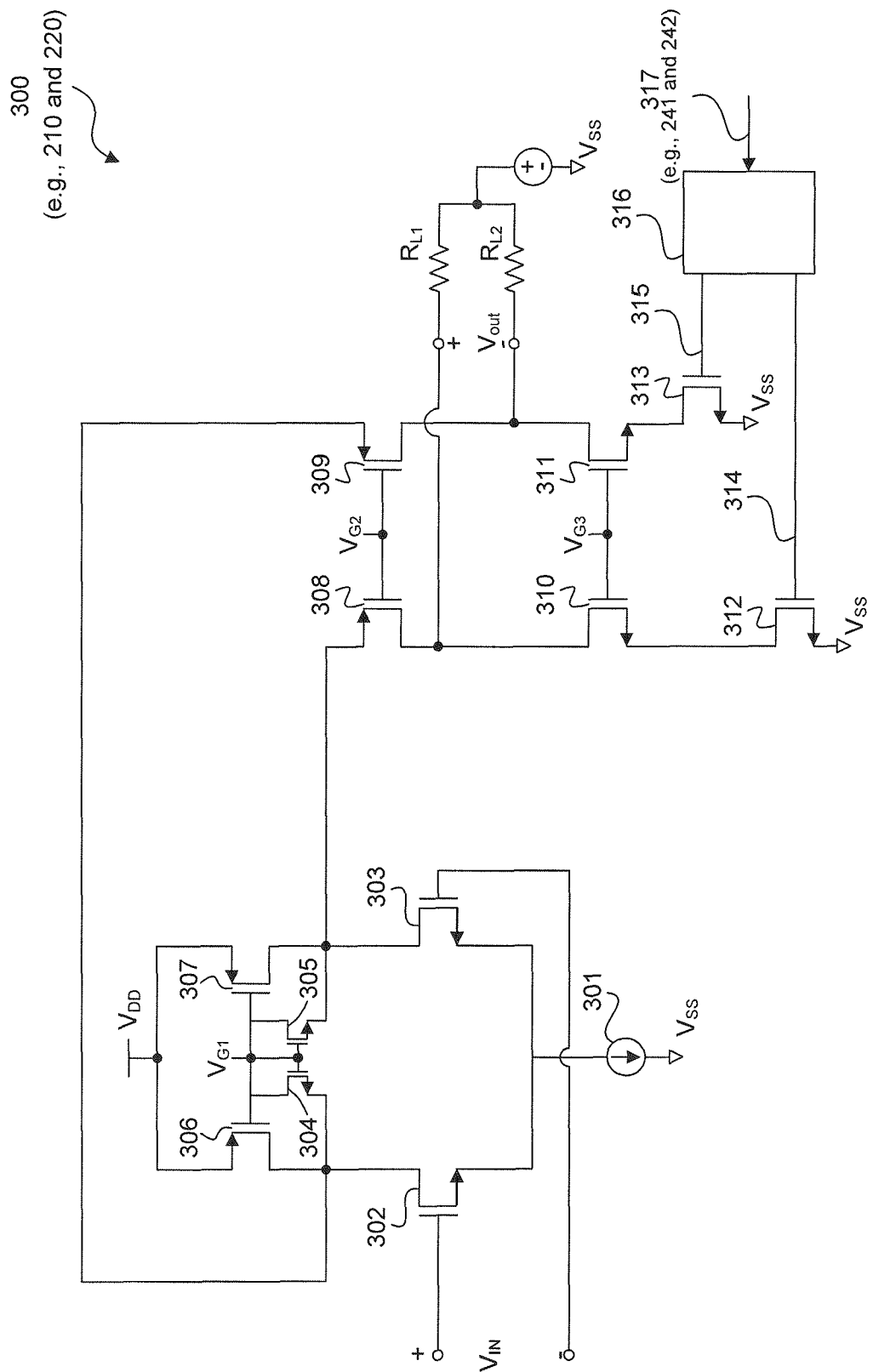
FIG. 3 is an illustration of an embodiment of a fully-differential amplifier.

FIG. 3 is an illustration of a fully-differential amplifier 300, which is an embodiment of amplifiers 210 and 220. Amplifier 300 is a fully-differential folded-cascode amplifier. Amplifier 300 includes a tail current source 301, input transistors 302 and 303, an active load that includes transistors 304-307, cascode transistors 308 and 309, a first current source that includes transistors 310 and 312, a second current source that includes transistors 311 and 313, load resistors $R_{L1}$ and $R_{L2}$, and a voltage control unit 316. Positive differential input $V_{IN}^+$ and negative differential input $V_{IN}^-$ are inputs to amplifier 300 and positive differential output $V_{OUT}^+$ and negative differential output $V_{OUT}^-$ are outputs of amplifier 300, as would be understood by a person skilled in the relevant art. Further, as would be understood by a person skilled in the relevant art, voltages $V_{G1}$, $V_{G2}$, and $V_{G3}$ each provide a bias voltage to the gate terminals of their respective transistors.

In an embodiment, as depicted in FIG. 3, voltage control unit 316 is included as a component of amplifier 300. In another embodiment, voltage control unit 316 can be in a location external to amplifier 300 such as, for example and without limitation, in processing unit 240 of FIG. 2 or in a location that is external to both amplifier 300 of FIG. 3 and processing unit 240 of FIG. 2.

In reference to FIG. 3, voltage control unit 316 is a digital-to-analog converter (DAC) configured to provide voltages to the gate terminals of transistors 312 and 313 based on a digital control input 317 (e.g., which is coupled to control signal 241 from processing unit 240 of FIG. 2), according to an embodiment of the present invention. Based on the voltage applied to the gate terminals of transistors 312 and 313, the currents flowing through transistors 312 and 313 can be adjusted. In turn, the currents flowing through transistors 310 and 311 are also adjusted. By adjusting the current flowing through transistor 310, the voltage at the positive differential output of amplifier 300 (i.e., $V_{OUT}^+$) can also be adjusted, according to an embodiment of the present invention. Similarly, by adjusting the current flowing through transistor 311, the voltage at the negative differential output of amplifier 300 (i.e., $V_{OUT}^-$) can also be adjusted, according to an embodiment of the present invention.

As understood by a person skilled in the relevant art, based on digital information on control input 317, the voltages on outputs 314 and 315 can vary. Control signal 317 is generated by processing unit 240 of FIG. 2, according to an embodiment of the present invention. Embodiments of processing unit 240 are described in further detail below. Based on the description herein, a person skilled in the relevant will recognize that other amplifier topologies and associated techniques to adjust the output voltages of these other amplifier topologies can be used with the embodiments described herein. These other amplifier topologies and output voltage offset techniques are within the scope and spirit of the embodiments described herein.

Ideally, amplifiers such as amplifiers 210 and 220 of FIG. 2 are configured to amplify only a voltage difference between its two inputs, rejecting all voltages that are common to both, and to provide the amplified voltage difference at its output with no DC offset. However, due to mismatches in the active devices of the amplifier, a DC offset often exists at the output of the amplifier. Varying DC offsets at the outputs of amplifiers 210 and 220 can play a significant role in the accuracy of a circuit that incorporates amplifiers 210 and 220 (e.g., dual-residue ADC 100 of FIG. 1).

In reference to FIG. 2, a goal of offset calibration circuit 200, among other things, is to calibrate an offset in amplifiers 210 and 220. Offset calibration circuit 200 can be used to trim a DC offset in amplifiers 210 and 220 such that a voltage differential between the positive and negative differential outputs (e.g., $V_{OUT}^+$ and $V_{OUT}^-$, respectively) produces a predetermined comparator output (e.g., output 232 of comparator 230), according to an embodiment of the present invention. As a result, a DC offset, if any, in the outputs of amplifiers 210 and 220 can be equal or substantially equal to one another. An equal or substantially equal DC offset in the outputs of amplifiers 210 and 220 improves accuracy in circuit applications such as, for example and without limitation, a dual-residue ADC (e.g., dual-residue ADC 100 of FIG. 1). For instance, in using a single comparator in offset calibration circuit 200 (e.g., comparator 230), a common offset is introduced in amplifiers 210 and 220. This identical or nearly identical offset in amplifiers 210 and 220 does not introduce an error in the analog-to-digital conversion process in the dual-residue ADC.

In an embodiment, offset calibration circuit 200 has two modes of operation—an amplification mode of operation and an offset calibration mode of operation. In an embodiment, processing unit 240 is configured to control switches 211-215 and 221-225 during the amplification mode of operation and the offset calibration mode of operation. Alternatively, in another embodiment, another processing unit (not shown in FIG. 2) can be configured to control switches 211-215 and 221-225 during the amplification and offset calibration modes of operation.

During the amplification mode of operation, switches 211 and 212 couple the outputs of amplifier 210 to external circuit 250, switch 213 is open, and switches 214 and 215 are closed, according to an embodiment of the present invention. Amplifier 210 receives voltage inputs $V_{IN,0}$ and $V_{IN,1}$ and is configured to amplify the difference between the two voltage inputs ($V_{IN,0}$-$V_{IN,1}$) to produce $V_{OUT,0}$ and $V_{OUT,1}$. Voltage inputs $V_{IN,0}$ and $V_{IN,1}$ can be derived from, for example and without limitation, a reference ladder of a dual-residue ADC (e.g., reference ladder 111 in dual-residue 100 of FIG. 1). In an embodiment, $V_{OUT,1}$ and $V_{OUT,0}$ represent positive and negative differential outputs of amplifier 210, respectively. The output differential voltage of amplifier 210 is defined by the difference between the positive and negative differential outputs ($V_{OUT,1}$-$V_{OUT,0}$).

Still referring to FIG. 2, during the amplification mode of operation, switches 221 and 222 couple the outputs of amplifier 220 to external circuit 250, according to an embodiment of the present invention. Amplifier 220 receives voltage inputs $V_{IN,2}$ and $V_{IN,3}$ and is configured to amplify the difference between the two voltage inputs ($V_{IN,2}$-$V_{IN,3}$) during the amplification mode of operation. Voltage inputs $V_{IN,2}$ and $V_{IN,3}$ can be derived from, for example and without limitation, a reference ladder of a dual-residue ADC (e.g., reference ladder 111 in dual-residue 100 of FIG. 1). In an embodiment, $V_{OUT,3}$ and $V_{OUT,2}$ represent positive and negative differential outputs of amplifier 220, respectively. The output differential voltage of amplifier 220 is defined by the difference between the positive and negative differential outputs ($V_{OUT,3}$-$V_{OUT,2}$).

The offset calibration mode of operation for offset calibration circuit 200 has two phases of operation, according to an embodiment of the present invention. During the first phase, the differential outputs of amplifier 210 are coupled to comparator 230. During the second phase, the differential outputs of amplifier 220 are coupled to comparator 230.

During the first phase of the offset calibration mode of operation, switches 211 and 212 couple the differential outputs of amplifier 210 to comparator 230 and switch 213 is closed, according to an embodiment of the present invention. In an embodiment, during the first phase of the offset calibration mode of operation, either switch 214 or switch 215 is closed. If switch 214 is closed, both inputs of amplifier 210 receive voltage input $V_{IN,0}$, in which $V_{IN,0}$ is set to zero volts according to an embodiment of the present invention. Similarly, if switch 215 is closed, both inputs of amplifier 210 receive voltage input $V_{IN,1}$, in which $V_{IN,1}$ is set to zero volts according to an embodiment of the present invention. For ease of explanation, switch 214 is closed and switch 215 is open during the first phase of the offset calibration mode of operation. However, based on the description herein, a person skilled in the relevant art will recognize that switch 215 can be closed and switch 214 can be open during the first phase of the offset calibration mode operation, thus providing voltage input $V_{IN,1}$ (e.g., zero volts) to both inputs of amplifier 210.

With respect to amplifier 220, during the second phase of the offset calibration mode of operation, switches 221 and 222 couple the differential outputs of amplifier 220 to comparator 230 and switch 223 is closed, according to an embodiment of the present invention. In an embodiment, during the second phase of the offset calibration mode of operation, either switch 224 or switch 225 is closed. If switch 224 is closed, both inputs of amplifier 220 receive voltage input $V_{IN,2}$, in which $V_{IN,2}$ is set to zero volts according to an embodiment of the present invention. Similarly, if switch 225 is closed, both inputs of amplifier 220 receive voltage input $V_{IN,3}$, in which $V_{IN,3}$ is set to zero volts according to an embodiment of the present invention. For ease of explanation, switch 224 is closed and switch 225 is open during the second phase of the offset calibration mode of operation. However, based on the description herein, a person skilled in the relevant art will recognize that switch 225 can be closed and switch 224 can be open during the second phase of the offset calibration mode operation, thus providing voltage input $V_{IN,3}$ (e.g., zero volts) to both inputs of amplifier 220.

As would be understood by a person skilled in the relevant art, by providing a common input voltage (e.g., zero volts) to the input terminals of amplifiers 210 and 220, amplifiers 210 and 220 should not amplify the common voltage applied to each of their respective input terminals. In other words, the differential inputs of the respective amplifiers are shorted together during their respective phases. However, as mentioned above, the fabrication of amplifiers such as amplifiers 210 and 220 oftentimes have imperfections, which can lead to a DC offset at the outputs of amplifiers 210 and 220. In an embodiment, comparator 230 and processing unit 240 facilitate in adjusting a DC offset in amplifiers 210 and 220, if any, such that the DC offset in amplifier 210 is equal to or substantially equal to the DC offset in amplifier 220.

With respect to comparator 230 in FIG. 2, comparator 230 is configured to compare the positive differential output $V_{OUT,1}$ to the negative differential output $V_{OUT,0}$ of amplifier 210 during the first phase of the offset calibration mode of operation. If $V_{OUT,1}$ is greater than $V_{OUT,0}$, then an output 232 of comparator 230 has a value of a supply voltage of comparator 230 (e.g., $V_{DD}$) or logic "1." Conversely, if $V_{OUT,1}$ is less than $V_{OUT,0}$, then an output 232 of comparator 230 has a value of a ground supply voltage of comparator 230 (e.g., $V_{SS}$) or logic "0." Alternatively, in an embodiment, if $V_{OUT,0}$ is greater than $V_{OUT,1}$, then output 232 of comparator 230 has a value of the supply voltage of comparator 230 or logic "1." Conversely, if $V_{OUT,0}$ is less than $V_{OUT,1}$, then output 232 of comparator 230 has a value of the ground supply voltage of comparator 230 or logic "0." The function and operation of comparator circuits are known to persons skilled in the relevant art.

In an embodiment, comparator 230 is configured to compare the positive differential output $V_{OUT,3}$ to the negative differential output $V_{OUT,2}$ of amplifier 220 during the second phase of the offset calibration mode of operation. In an embodiment, if $V_{OUT,3}$ is greater than $V_{OUT,2}$, then an output 232 of comparator 230 has a value of the supply voltage of comparator 230 (e.g., $V_{DD}$) or logic "1." Conversely, if $V_{OUT,3}$ is less than $V_{OUT,2}$, then an output 232 of comparator 230 has a value of the ground supply voltage of comparator 230 or logic "0." Alternatively, in an embodiment, if $V_{OUT,2}$ is greater than $V_{OUT,3}$, then output 232 of comparator 230 has a value of the supply voltage of comparator 230 or logic "1." Conversely, if $V_{OUT,2}$ is less than $V_{OUT,3}$, then output 232 of comparator 230 has a value of the ground supply voltage of comparator 230 or logic "0."

In an embodiment, comparator 230 is a clocked comparator with an enable signal 231 that is controlled by a clock signal. In an embodiment, the enable signal for comparator 230 can be an "active-low" signal, in which comparator 230 is activated or turned "ON" when the clock signal is "low" or logic "0." Clocked comparators are known to persons skilled in the relevant art.

In reference to FIG. 2, processing unit 240 receives and processes output 232 from comparator 230. In an embodiment, processing unit 240 is configured to monitor output 232 and to maintain a predetermined comparator output at output 232. For instance, as would be understood by a person skilled in the relevant art, comparator 230 of FIG. 2 has two output values—a logic "1" and a logic "0." Processing unit 240, with control signals 241 and 242, forces the predetermined comparator output to toggle between a logic "1" and a logic "0" during consecutive comparison cycles, according to an embodiment of the present invention. In other words, the predetermined comparator output has an opposite logical output value compared to a previous comparison cycle. In monitoring the toggling of the comparator output between logic "1" and logic "0" during consecutive comparison cycles, this ensures that DC voltages present on $V_{OUT,0}$ and $V_{OUT,1}$ of amplifier 210 are equal or substantially equal to one another, resulting in zero or substantially zero DC offset for amplifier 210. This is also equally applicable to the DC voltages present on $V_{OUT,2}$ and $V_{OUT,3}$ of amplifier 220.

In an embodiment, processing unit 240 provides control information to amplifier 210 via control signal 241. Control signal 241 provides digital control information to amplifier 210 to adjust the positive differential voltage $V_{OUT,1}$, the negative differential voltage $V_{OUT,0}$, or both the positive and negative differential voltages $V_{OUT,1}$ and $V_{OUT,0}$, respectively, such that the predetermined comparator output (e.g., toggle between logic "1" and logic "0") is maintained.

In particular, amplifier 210 can be represented by fully-differential amplifier 300 of FIG. 3, in which control signal 317 of amplifier 300 is coupled to control signal 241 of processing unit 240, according to an embodiment of the present invention. As described above, in an embodiment, control signal 241 provides digital control information to amplifier 210 to adjust the amplifier's differential outputs (e.g., $V_{OUT,1}$ and $V_{OUT,0}$). In reference to amplifier 300 of FIG. 3, the amplifier's differential outputs are represented by positive differential output $V_{OUT}^+$ and negative differential output $V_{OUT}^-$. As described above, with respect to FIG. 3, the voltages at $V_{OUT}^+$ and $V_{OUT}^-$ can be adjusted based on the voltages applied on the gate terminals of transistors 312 and 313, respectively, according to an embodiment of the present invention. In an embodiment, the voltages applied on the gate terminals of transistors 312 and 313 are adjusted based on control signal 317 (e.g., which is control signal 241 of processing unit 240 for amplifier 210).

For instance, if positive differential output $V_{OUT}^+$ is greater than negative differential output $V_{OUT}^-$ of amplifier 300, voltage outputs 314 and 315 from voltage control unit 316 can be adjusted based on digital information carried by control signal 317 (e.g., which is control signal 241 of processing unit 240 for amplifier 210), according to an embodiment of the present invention. In an embodiment, the voltage on positive differential output $V_{OUT}^+$ can be lowered to or substantially near to the voltage on negative differential output $V_{OUT}^-$ by increasing the voltage applied to the gate terminal of transistor 312 (via voltage output 314), resulting in an increase in current flowing through transistor 310. In another embodiment, the voltage on negative differential output $V_{OUT}^-$ can be raised to or substantially near the voltage on positive differential output $V_{OUT}^+$ by decreasing the voltage applied to the gate terminal of transistor 313 (via voltage output 315), resulting in a decrease in current flowing through transistor 311. Alternatively, in yet another embodiment, the voltage on positive differential output $V_{OUT}^+$ can be lowered and the voltage on negative differential output $V_{OUT}^-$ can be raised using the aforementioned techniques, such that the voltages on the positive and negative differential outputs $V_{OUT}^+$ and $V_{OUT}^-$, respectively, are equal to or substantially equal to one another.

During the second phase of the offset calibration mode of operation, processing unit 240 is configured to monitor output 232 of comparator 230 and to maintain the predetermined comparator output at output 232 in a similar manner as described above with respect to the first phase of the offset calibration mode, according to an embodiment of the present invention. Processing unit 240 provides control information to amplifier 220 via control signal 242. Control signal 242 provides digital control information to amplifier 220 to adjust the positive differential voltage $V_{OUT,3}$, the negative differential voltage $V_{OUT,2}$, or both the positive and negative differential voltages $V_{OUT,3}$ and $V_{OUT,2}$, respectively, such that the predetermined comparator output (e.g., logic "0") is maintained. Further, in a similar manner as described above with respect to the first phase of the offset calibration mode of operation, amplifier 220 can be represented as fully-differential amplifier 300 of FIG. 3, in which control signal 317 of amplifier 300 is coupled to control signal 242 of processing unit 240 (for amplifier 220), according to an embodiment of the present invention.

A goal of voltage control unit 316 of FIG. 3, among others, is to adjust the voltages on positive and negative differential outputs $V_{OUT}^+$ and $V_{OUT}^-$ of amplifier 300 such that the predetermined comparator output is maintained (e.g., toggle between logic "1" and logic "0"). In particular, as a result of the voltage adjustments on either of both of the positive differential output $V_{OUT}^+$ and the negative differential output $V_{OUT}^-$ in amplifier 300, the value on output 232 of comparator 230 can be maintained at the predetermined comparator output value (e.g., toggle between logic "1" and logic "0"). By maintaining the predetermined comparator output value for amplifier 210, a DC offset (if any) in the output of amplifier 210 can be equal or substantially equal to a DC offset (if any) in the output of amplifier 220, according to an embodiment of the present invention. As noted above, an equal or substantially equal DC offset in the outputs of amplifiers 210 and 220 improves accuracy in circuit applications such as, for example and without limitation, a dual-residue ADC (e.g., dual-residue ADC 100 of FIG. 1). For instance, in using a single comparator in offset calibration circuit 200 (e.g., comparator 230), a common offset is introduced in amplifiers 210 and 220. This identical or nearly identical offset in amplifiers 210 and 220 does not introduce an error in the analog-to-digital conversion process in the dual-residue ADC.

Figure 4:
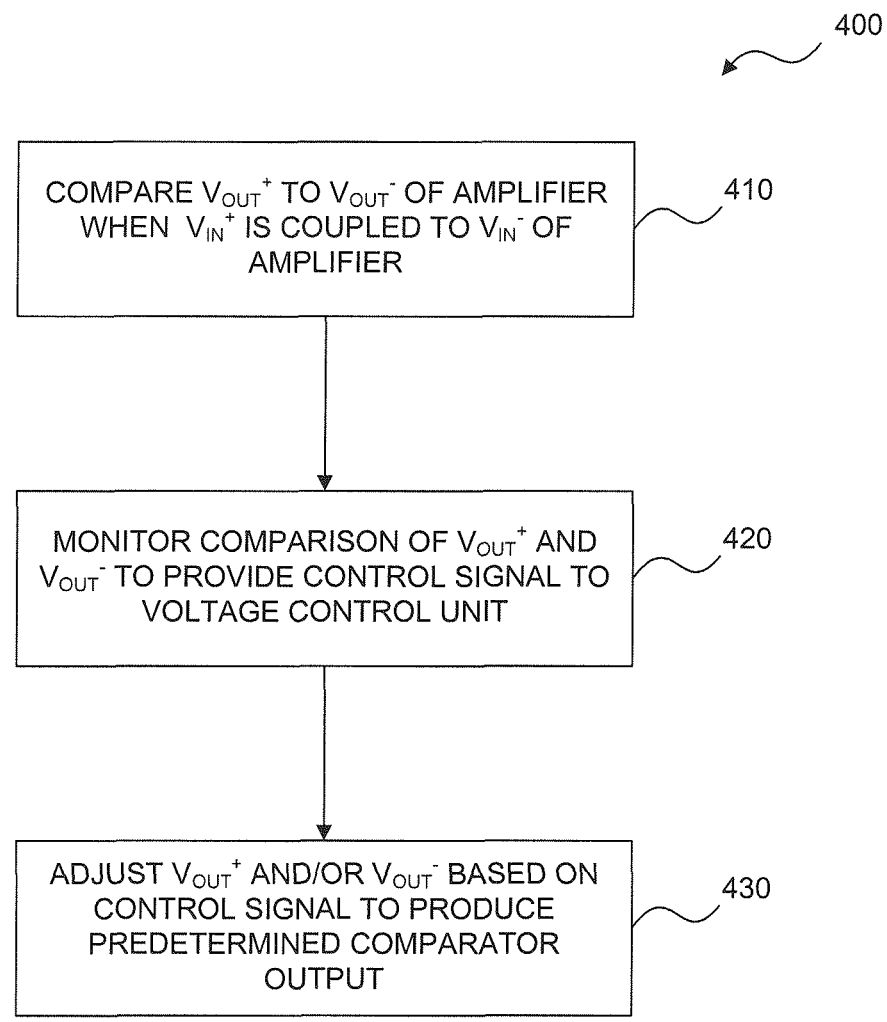
FIG. 4 is an illustration of an embodiment of a method for calibrating an offset in an amplifier.

FIG. 4 is an illustration of a method 400 for calibrating an offset in an amplifier. Method 400 can occur using, for example, offset calibration circuit 200 of FIG. 2.

In step 410, a first voltage on a positive differential output ($V_{OUT}^+$) is compared to a second voltage on a negative differential output ($V_{OUT}^-$) of an amplifier when a positive differential input ($V_{IN}^+$) is coupled to a negative differential input ($V_{IN}^-$) of the amplifier. The comparison in step 410 can be performed using, for example, comparator 230 of FIG. 2.

In an embodiment, the comparison in step 410 is performed using a clocked comparator circuit, in which the clocked comparator is enabled during a reset phase in an analog-to-digital conversion process for a dual-residue ADC (e.g., dual-residue ADC 100 of FIG. 1). An analog-to-digital conversion in the dual-residue ADC can have two phases: an amplification phase (also referred to herein as the "amplification mode of operation") and a reset phase (in which residue signals are not amplified by the residue amplifiers of the dual-residue ADC). The time period allocated to the reset phase portion of the analog-to-digital conversion process can be used to calibrate an offset in the residue amplifiers (also referred to herein as the "offset calibration mode of operation"), according to an embodiment of the present invention.

Figure 5:
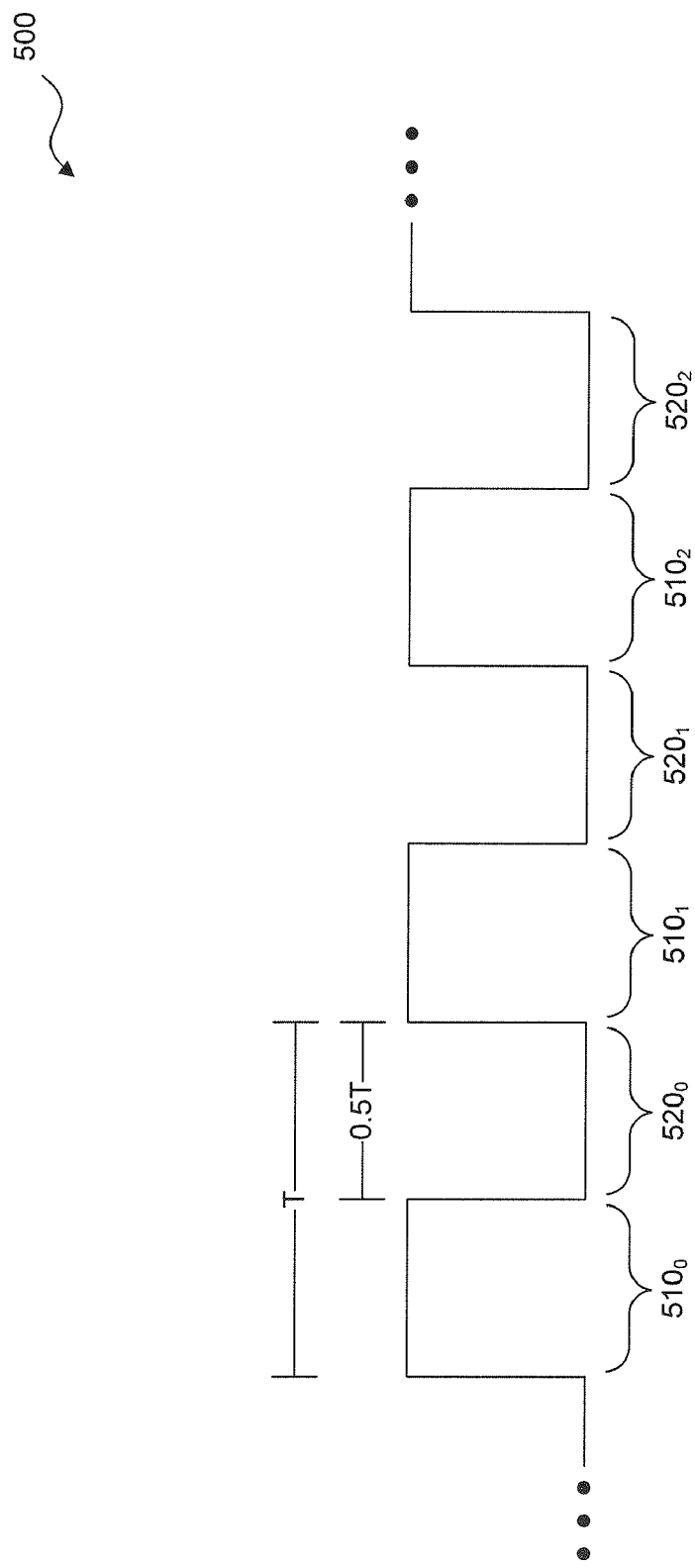
FIG. 5 is an illustration of an exemplary clock waveform.

For ease of explanation, a clock waveform with a 50% duty cycle will be used to facilitate in the description of method 400. FIG. 5 is an illustration of an exemplary clock waveform 500 with a period (T) and a 50% duty cycle. Time periods $510_{0-2}$ represent periods in clock waveform 500 in which the amplification mode of operation occurs, according to an embodiment of the present invention. Time periods $520_{0-2}$ represent periods in clock waveform 500 in which the offset calibration mode of operation occurs, according to an embodiment of the present invention. Based on the description herein, a person skilled in the relevant art will recognize that clock waveform 500 of FIG. 5 can have other duty cycles, in which the amplification and offset calibration modes of operation can be allocated to the time periods for logic 1's and logic 0's of the clock waveform.

During the offset calibration mode of operation, $V_{IN}^+$ and $V_{IN}^-$ of the amplifier are coupled to one another such that the differential input is shorted, $V_{OUT}^+$ is coupled to a first input terminal of the comparator, and $V_{OUT}^-$ is coupled to a second input terminal of the comparator, according to an embodiment of the present invention. In reference to clock waveform 500 of FIG. 5, $V_{OUT}^+$ and $V_{OUT}^-$ are compared to one another using the clocked comparator that is enabled during the offset calibration mode of operation. In an embodiment, the clocked comparator can have an "active-low" enable signal that is activated when clock waveform 500 is at a logic "0" value (e.g., during time periods $520_{0-2}$ of clock waveform 500). The output of the clocked comparator is either a logic "0" or a logic "1," which is an indication on whether a predetermined comparator output is maintained (e.g., toggle between logic "1" and logic "0").

In an amplifier system with a first amplifier and a second amplifier, such as offset calibration circuit 200 of FIG. 2, the offset calibration mode of operation can have two phases—a first phase of the offset calibration mode of operation and a second phase of the offset calibration mode of operation. During the first phase of the offset calibration mode of operation, $V_{IN}^+$ and $V_{IN}^-$ of the first amplifier (e.g., amplifier 210 of FIG. 2) are coupled to one another such that the differential input is shorted, $V_{OUT}^+$ is coupled to the first input terminal of the comparator, and $V_{OUT}^-$ is coupled to the second input terminal of the comparator. Similarly, during the second phase of the offset calibration mode of operation, $V_{IN}^+$ and $V_{IN}^-$ of the second amplifier (e.g., amplifier 220 of FIG. 2) are coupled to one another such that the differential input is shorted, $V_{OUT}^+$ is coupled to the first input terminal of the comparator, and $V_{OUT}^-$ is coupled to the second input terminal of the comparator. In an embodiment, the first and second phases of the offset calibration mode of operation can occur one after another during the same time period in which clock waveform 500 is at a logic "0" (e.g., first and second phases of the offset calibration mode of operation occur one after another during time period $520_0$ of clock waveform 500).

In another embodiment, the first and second phases of the offset calibration mode of operation can occur in separate portions of clock waveform 500. For instance, the first phase of the offset calibration mode of operation can occur in time period $520_0$ and the second phase of the offset calibration mode of operation can occur in time period $520_1$. In yet another embodiment, the first and second phases of the offset calibration mode of operation can occur over multiple time periods in which clock waveform 500 is at a logic "0." For instance, the first phase of the offset calibration mode of operation can occur over time periods $520_0$ and $520_1$. Based on the description herein, a person skilled in the relevant art will recognize that, depending on the implementation of the amplifier system with the first and second amplifiers, the first and second phases of the offset calibration mode of operation can occur over a single time period, multiple time periods, or a combination thereof.

In step 420, the comparison of the first voltage on $V_{OUT}^+$ to the second voltage on $V_{OUT}^-$ is monitored to provide a control signal to a voltage control unit based on the comparison. Processing unit 240 of FIG. 2 can be used, for example, to monitor the comparison of the first voltage on $V_{OUT}^+$ to the second voltage on $V_{OUT}^-$.

In an embodiment, an output of the comparator (e.g., output 232 of FIG. 2) can be sampled by processing unit 240 of FIG. 2 over multiple time periods $520_{0-2}$ of clock waveform 500 and, based on the sampling results, the first voltage on $V_{OUT}^+$ and/or the second voltage on $V_{OUT}^-$ can be adjusted. A goal, among others, of the embodiments described herein is to eliminate or substantially reduce a DC offset (if any) present in the differential outputs of the amplifiers (e.g., DC offset between $V_{OUT,0}$ and $V_{OUT,1}$ of amplifier 210 and DC offset between $V_{OUT,2}$ and $V_{OUT,3}$ of amplifier 220) by setting the DC voltages on the differential output of each of the amplifiers to be equal or substantially equal to one another. This goal can be achieved by monitoring the output of the comparator to ensure that the output toggles between logic "1" and logic "0" during consecutive comparison cycles and making adjustments, via control signals 241 and 242, if needed.

In step 430, at least one of the first voltage on $V_{OUT}^+$ and the second voltage on $V_{OUT}^-$ is adjusted based on the control signal such that the first and second voltages on $V_{OUT}^+$ and $V_{OUT}^-$, respectively, produce a predetermined comparator output. In an embodiment, the voltage control unit adjusts a first current associated with $V_{OUT}^+$ and/or a second current associated with $V_{OUT}^-$ to adjust the corresponding voltages on $V_{OUT}^+$ and/or $V_{OUT}^-$ such that the first and second voltages on $V_{OUT}^+$ and $V_{OUT}^-$, respectively, produce the predetermined comparator output (e.g., toggle between logic "1" and logic "0").

With respect to steps 420 and 430, the output of the comparator can be sampled during time periods $520_{0-4}$, in which the sampling process produces a logic "1" during time period $520_0$, a logic "0" during time period $520_1$, a logic "1" during time period $520_2$, a logic "1" during time period $520_3$ (not shown in clock waveform 500 of FIG. 5), and a logic "0" during time period $520_4$ (not shown in clock waveform 500) at the output of the comparator. From these five time periods $520_{0-4}$, a processing unit (e.g., processing unit 240 of FIG. 2) can determine that the output of the comparator did not toggle between logic "1" and logic "0" between consecutive comparison cycles (e.g., between time period $520_1$ and $520_2$). Based on this determination, the first and second voltages on $V_{OUT}^+$ and $V_{OUT}^-$, respectively, can be adjusted to generate the desired comparator output that toggles between logic "1" and logic "0" between consecutive comparator outputs. Based on the description herein, a person skilled in the relevant art will recognize that other methods and techniques can be used to sample and compare the sampled results over multiple time periods and, based on the results of these methods and techniques, adjust the first and second voltages on $V_{OUT}^+$ and $V_{OUT}^-$, respectively, to produce the predetermined comparator output (e.g., toggle between logic "1" and logic "0").

Figure 6:
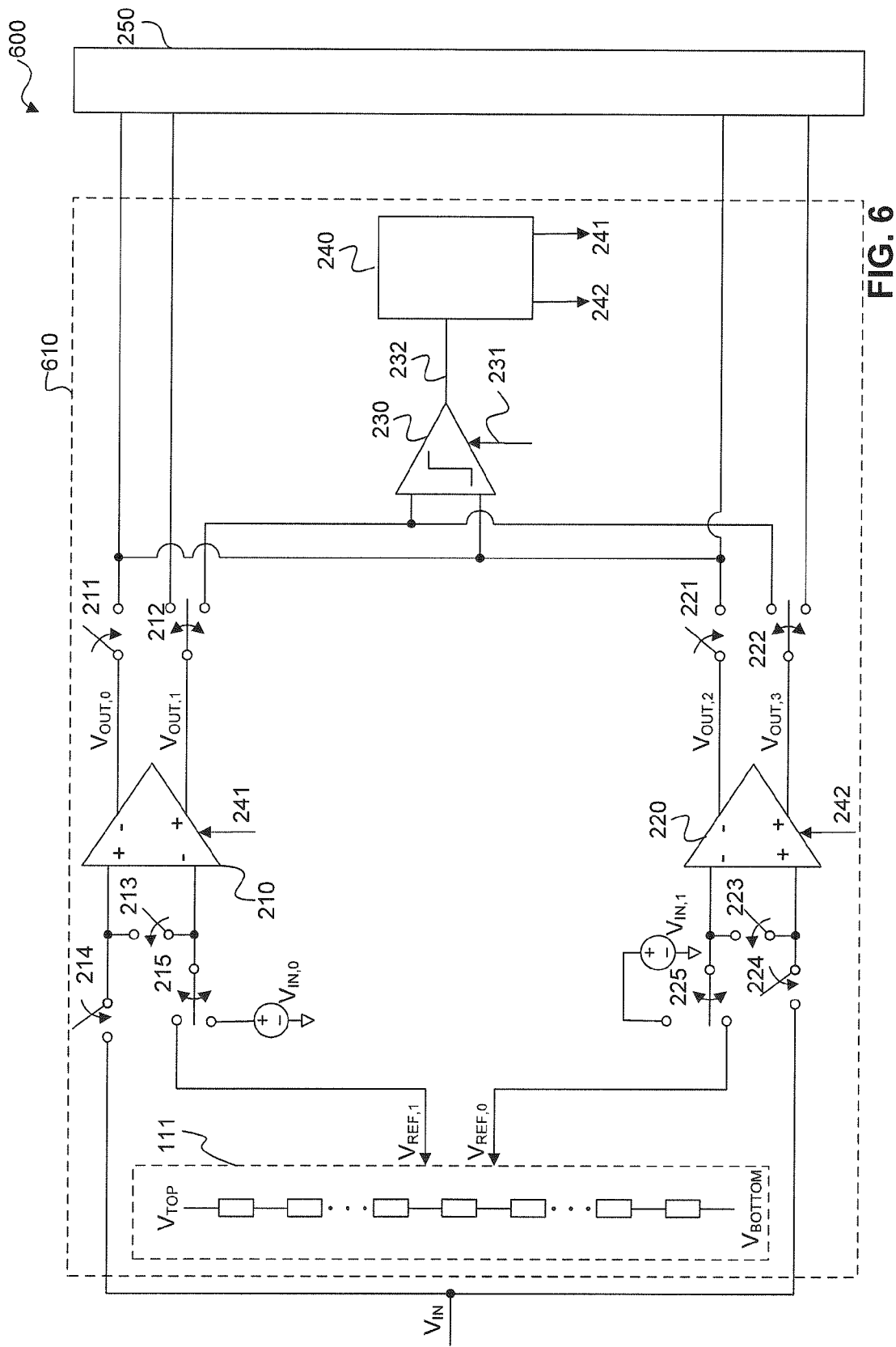
FIG. 6 is an illustration of an embodiment of a system to calibrate an offset in one or more residue amplifiers in a dual-residue analog-to-digital converter.

FIG. 6 is an illustration of a system 600 to calibrate an offset in one or more residue amplifiers in a dual-residue ADC. System 600 includes a dual-residue ADC stage 610 that is configured to receive an input voltage $V_{IN}$ and to output amplified residue signals $V_{OUT,1}$ and $V_{OUT,3}$ to a second dual-residue ADC stage (partially represented by reference ladder 121). Dual-residue ADC stage 610 includes reference ladder 111, amplifier 210, switches 211-215, amplifier 220, switches 221-225, comparator 230, processing unit 240, and external circuit 250. The components of dual-residue ADC stage 610 operate in a similar manner as described above with respect to FIGS. 1 and 2.

With respect to external circuit 250, this circuit can include a reference ladder that is connected between $V_{OUT,1}$ and $V_{OUT,3}$ (not shown in FIG. 6) and another reference ladder that is connected between $V_{OUT,0}$ and $V_{OUT,2}$ (not shown in FIG. 6). In other words, a reference ladder having a plurality of resistive elements has a first terminal connected to $V_{OUT,1}$ and a second terminal connected to $V_{OUT,3}$. In a similar manner, another reference ladder having a plurality of resistive elements has a first terminal connected to $V_{OUT,0}$ and a second terminal connected to $V_{OUT,2}$. As would be understood by a person skilled in the art, these two reference ladders in external circuit 250 operate in conjunction with ADC stage 610 during the analog-to-digital conversion process.

A benefit, among others, of the circuit architecture in system 600 is the low complexity of the offset calibration circuit. This low complexity can lead to a minimal impact to chip size area allocated to the offset calibration circuit, and also lead to a relatively fast convergence time in assessing offsets (if any) in system 600. The relatively fast convergence time is beneficial in the production testing of dual-residue ADC circuits such as system 600. Further, the implementation of the offset calibration circuits in system 600 does not interact with the signal path associated with quantization in the analog-to-digital conversion process (which involve reference ladders 111 and 121), thus minimizing the offset calibration circuit's impact on signal-to-noise ratio.

In an embodiment, system 600 has two modes of operation—an amplification mode of operation and an offset calibration mode of operation. During the amplification mode of operation, switch 215 couples $V_{REF,1}$ to a negative input terminal of amplifier 210, switches 211 and 213 are open, and switch 212 couples $V_{OUT,1}$ to reference ladder 121. A positive input terminal of amplifier 210 is also coupled to $V_{IN}$ using switch 214. Similarly, during the amplification mode of operation, switch 225 couples $V_{REF,0}$ to a negative input terminal of amplifier 220, switches 221 and 223 are open, and switch 222 couples $V_{OUT,3}$ to reference ladder 121. A positive input terminal of amplifier 220 is also coupled to $V_{IN}$ using switch 224. Residue voltages ($V_{IN}$-$V_{REF,1}$) and ($V_{IN}$-$V_{REF,0}$) are amplified by amplifiers 210 and 220, respectively, producing $V_{OUT,1}$ and $V_{OUT,3}$. Together with the digital output code of the first ADC, an interpolated zero-crossing (x) between $V_{OUT,1}$ and $V_{OUT,3}$ is a measure of the input voltage $V_{IN}$.

In an embodiment, the offset calibration mode of operation can have two phases of operation. During the first phase, the differential outputs of amplifier 210 (i.e., negative output terminal $V_{OUT,0}$ and positive output terminal $V_{OUT,1}$) are coupled to comparator 230. In particular, switches 211 and 212 couple the differential outputs of amplifier 210 to comparator 230 and switch 213 is closed to short the differential input of amplifier 210, according to an embodiment of the present invention. In addition, switch 214 is open and switch 215 couples $V_{IN,0}$ to the differential inputs of amplifier 210 (via switch 213), in which $V_{IN,0}$ is set to zero volts according to an embodiment of the present invention.

During the second phase of the offset calibration mode of operation, the differential outputs of amplifier 220 (i.e., negative output terminal $V_{OUT,2}$ and positive output terminal $V_{OUT,3}$) are coupled to comparator 230. In particular, switches 221 and 222 couple the difference outputs of amplifier 220 to comparator 230 and switch 223 is closed to short the differential input of amplifier 220, according to an embodiment of the present invention. In addition, switch 224 is open and switch 225 couples $V_{IN,1}$ to the differential inputs of amplifier 220 (via switch 223), in which $V_{IN,1}$ is set to zero volts according to an embodiment of the present invention.

In a similar manner, as described above with respect to FIG. 2, comparator 230 and processing unit 240 process the differential outputs of amplifiers 210 and 220 during the first and second phases of the offset calibration mode of operation such that a predetermined comparator output (e.g., toggle between logic "1" and logic "0") is maintained at output 232. In an embodiment, processing unit 240 can control the voltages of the differential outputs of amplifiers 210 and 220 via control signals 241 and 242, respectively, in a similar manner as described above with respect to FIG. 2. By maintaining the predetermined comparator output value for amplifier 210, a DC offset (if any) in the output of amplifier 210 can be equal or substantially equal to a DC offset (if any) in the output of amplifier 220, according to an embodiment of the present invention. As a result, an equal DC offset in the outputs of amplifiers 210 and 220 improves accuracy in system 600. Additionally, in using a single comparator in system 600 (e.g., comparator 230), a common offset is introduced in amplifiers 210 and 220, in which this identical or nearly identical offset in amplifiers 210 and 220 does not introduce an error in the analog-to-digital conversion process of system 600.

Based on the description herein, a person skilled in the relevant art will recognize that additional dual-residue ADC stages can be added to system 600. Additionally, based on the description herein, a person skilled in the relevant art will recognize that each of the additional dual-residue ADC stages can have its own comparator and processing unit (e.g., comparator 230 and processing unit 240, respectively), each of the additional dual-residue ADC stages can share the same comparator and processing unit as dual-residue ADC stage 610 of FIG. 6, or a combination thereof. A benefit, among others, in sharing the same comparator (e.g., comparator 230) among multiple dual-residue ADC stages is that a common offset (if any) introduced by the comparator will be present in all of the dual-residue ADC stages. As noted above, this common offset does not introduce an error in the analog-to-digital conversion process of dual-residue ADCs.

Figure 7:
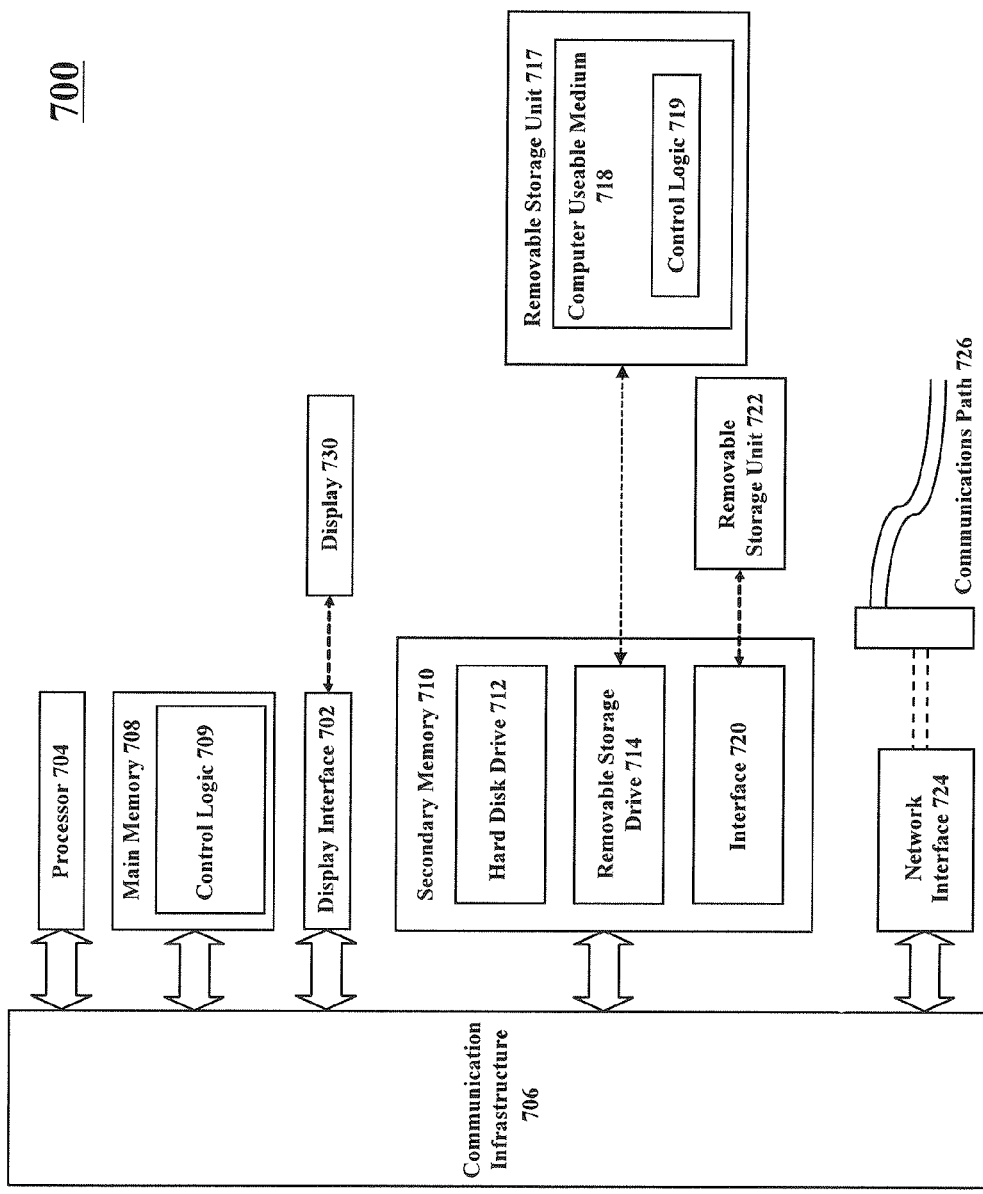
FIG. 7 is an illustration of an example computer system in which embodiments of the present invention can be implemented.

Various aspects of the embodiments described herein may be implemented in software, firmware, hardware, or a combination thereof. FIG. 7 is an illustration of an example computer system 700 in which embodiments described herein, or portions thereof, can be implemented as computer-readable code such as, for example and without limitation, the method illustrated by flowchart 400 of FIG. 4. Various embodiments are described in terms of this example computer system 700. After reading this description, it will become apparent to a person skilled in the relevant art how to implement embodiments described herein using other computer systems and/or computer architectures.

Computer system 700 can be any commercially available and well known computer capable of performing the functions described herein, such as computers available from International Business Machines, Apple, Sun, HP, Dell, Compaq, Cray, etc.

Computer system 700 includes one or more processors, such as processor 604. Processor 704 may be a special purpose or a general-purpose processor. Processor 704 is connected to a communication infrastructure 706 (e.g., a bus or network).

Computer system 700 also includes a main memory 708, preferably random access memory (RAM), and may also include a secondary memory 710. Main memory 708 has stored therein a control logic 709 (computer software) and data. Secondary memory 710 can include, for example, a hard disk drive 712, a removable storage drive 714, and/or a memory stick. Removable storage drive 714 can comprise a floppy disk drive, a magnetic tape drive, an optical disk drive, a flash memory, or the like. The removable storage drive 714 reads from and/or writes to a removable storage unit 717 in a well-known manner. Removable storage unit 718 can include a floppy disk, magnetic tape, optical disk, etc. which is read by and written to by removable storage drive 718. As will be appreciated by persons skilled in the relevant art, removable storage unit 717 includes a computer-usable storage medium 718 having stored therein a control logic 719 (e.g., computer software) and/or data.

In alternative implementations, secondary memory 710 can include other similar devices for allowing computer programs or other instructions to be loaded into computer system 700. Such devices can include, for example, a removable storage unit 722 and an interface 720. Examples of such devices can include a program cartridge and cartridge interface (such as those found in video game devices), a removable memory chip (e.g., EPROM or PROM) and associated socket, and other removable storage units 722 and interfaces 720 which allow software and data to be transferred from the removable storage unit 722 to computer system 700.

Computer system 700 also includes a display 730 that communicates with computer system 700 via a display interface 702. Although not shown in computer system 700 of FIG. 7, as would be understood by a person skilled in the relevant art, computer system 700 can communicate with other input/output devices such as, for example and without limitation, a keyboard, a pointing device, and a Bluetooth device.

Computer system 700 can also include a communications interface 724. Communications interface 724 allows software and data to be transferred between computer system 700 and external devices. Communications interface 724 can include a modem, a network interface (such as an Ethernet card), a communications port, a PCMCIA slot and card, or the like. Software and data transferred via communications interface 624 are in the form of signals, which may be electronic, electromagnetic, optical, or other signals capable of being received by communications interface 724. These signals are provided to communications interface 724 via a communications path 726. Communications path 726 carries signals and may be implemented using wire or cable, fiber optics, a phone line, a cellular phone link, a RF link or other communications channels.

In this document, the terms "computer program medium" and "computer-usable medium" are used to generally refer to media such as removable storage unit 717, removable storage unit 718, and a hard disk installed in hard disk drive 712. Computer program medium and computer-usable medium can also refer to memories, such as main memory 708 and secondary memory 710, which can be memory semiconductors (e.g., DRAMs, etc.). These computer program products provide software to computer system 700.

Computer programs (also called computer control logic) are stored on main memory 708 and/or secondary memory 710. Computer programs may also be received via communications interface 724. Such computer programs, when executed, enable computer system 700 to implement embodiments described herein. In particular, the computer programs, when executed, enable processor 704 to implement processes described herein, such as the steps in the method illustrated by flowchart 400 of FIG. 4, discussed above. Accordingly, such computer programs represent controllers of the computer system 700. Where embodiments are implemented using software, the software can be stored on a computer program product and loaded into computer system 700 using removable storage drive 714, interface 720, hard drive 712 or communications interface 724.

Based on the description herein, a person skilled in the relevant art will recognize that the computer programs, when executed, can enable one or more processors to implement processes described above, such as the steps in the method illustrated by flowchart 400 of FIG. 4. In an embodiment, the one or more processors can be part of a computing device incorporated in a clustered computing environment or server farm. Further, in an embodiment, the computing process performed by the clustered computing environment such as, for example, the steps in the method illustrated by flowchart 400 may be carried out across multiple processors located at the same or different locations.

Based on the description herein, a person of skilled in the relevant art will recognize that the computer programs, when executed, can enable multiple processors to implement processes described above, such as the steps in the method illustrated by flowchart 400 of FIG. 4. In an embodiment, the computing process performed by the multiple processors can be carried out across multiple processors located at a different location from one another.

Embodiments are also directed to computer program products including software stored on any computer-usable medium (e.g., computer useable medium 718 and 731). Such software, when executed in one or more data processing device, causes a data processing device(s) to operate as described herein. Embodiments employ any computer-usable or -readable medium, known now or in the future. Examples of computer-usable mediums include, but are not limited to, primary storage devices (e.g., any type of random access memory), secondary storage devices (e.g., hard drives, floppy disks, CD ROMS, ZIP disks, tapes, magnetic storage devices, optical storage devices, MEMS, nanotechnological storage devices, etc.), and communication mediums (e.g., wired and wireless communications networks, local area networks, wide area networks, intranets, etc.).

Embodiments have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

While various embodiments have been described above, it should be understood that they have been presented by way of example only, and not limitation. It will be understood by those skilled in the relevant art that various changes in form and details can be made therein without departing from the spirit and scope of the embodiments described herein. It should be understood that this description is not limited to these examples. This description is applicable to any elements operating as described herein. Accordingly, the breadth and scope of this description should not be limited by any of the above-described exemplary embodiments, but should be defined only in accordance with the following claims and their equivalents.

What is claimed is:

1. An offset calibration apparatus, comprising:
   an amplifier having a positive differential input ($V_{IN}^+$), a negative differential input ($V_{IN}^-$), a positive differential output ($V_{OUT}^+$), and a negative differential output ($V_{OUT}^-$);
   a voltage control unit configured to adjust a first voltage on $V_{OUT}^+$ and a second voltage on $V_{OUT}^-$;
   a comparator configured to compare the first voltage on $V_{OUT}^+$ to the second voltage on $V_{OUT}^-$ when $V_{IN}^+$ and $V_{IN}^-$ are coupled to a common voltage;
   a processing unit configured to provide a control signal to the voltage control unit based on the comparison of the first and second voltages on $V_{OUT}^+$ and $V_{OUT}^-$, respectively, wherein the voltage control unit adjusts, based on the control signal, the first and second voltages on $V_{OUT}^+$ and $V_{OUT}^-$, respectively, to produce a predetermined comparator output.

2. The offset calibration apparatus of claim 1, further comprising:
   a first switch configured to couple $V_{IN}^+$ to $V_{IN}^-$ during an offset calibration mode of operation and to disconnect $V_{IN}^+$ from $V_{IN}^-$ during an amplification mode of operation, wherein the amplifier is configured to amplify a voltage difference between $V_{IN}^+$ and $V_{IN}^-$ during the amplification mode of operation;
   a second switch configured to couple $V_{OUT}^+$ to a first input terminal of the comparator during the offset calibration mode of operation and to disconnect $V_{OUT}^+$ from the first input terminal of the comparator during the amplification mode of operation; and
   a third switch configured to couple $V_{OUT}^-$ to a second input terminal of the comparator during the offset calibration mode of operation and to disconnect $V_{OUT}^-$ from the second input terminal of the comparator during the amplification mode of operation.

3. The offset calibration apparatus of claim 1, wherein the voltage control unit is configured to adjust a first current associated with $V_{OUT}^+$ and a second current associated with $V_{OUT}^-$ based on the control signal.

4. The offset calibration apparatus of claim 3, wherein the voltage control unit is configured to adjust a first voltage applied to a first gate terminal of a first transistor and to adjust a second voltage applied to a second gate terminal of a second transistor, the first and second transistors configured to adjust the first and second currents, respectively.

5. The offset calibration apparatus of claim 4, wherein the voltage control unit comprises a digital-to-analog converter configured to receive the control signal from the processing unit and to adjust the first and second voltages applied to the first and second gate terminals, respectively, based on the control signal.

6. The offset calibration apparatus of claim 1, wherein the comparator comprises a clocked comparator.

7. The offset calibration apparatus of claim 6, wherein the clocked comparator is configured to receive an enable signal and, based on an activation of the enable signal, compare the first voltage on $V_{OUT}^+$ to the second voltage on $V_{OUT}^-$.

8. The offset calibration apparatus of claim 1, wherein the amplifier comprises:
   an input stage configured to receive $V_{IN}^+$ and $V_{IN}^-$; and
   an output stage comprising a first current path associated with $V_{OUT}^+$ and a second current path associated with $V_{OUT}^-$, wherein the voltage control unit is configured to adjust at least one of the respective currents associated with the first and second current paths.

9. A method for calibrating an offset in an amplifier, comprising:
   comparing, with a comparator, a first voltage on a positive differential output ($V_{OUT}^+$) to a second voltage on a negative differential output ($V_{OUT}^-$) of an amplifier when a positive differential input ($V_{IN}^+$) is coupled to a negative differential input ($V_{IN}^-$) of the amplifier;
   monitoring the comparison of the first voltage on $V_{OUT}^+$ to the second voltage on $V_{OUT}^-$ to provide a control signal to a voltage control unit based on the comparison; and
   adjusting, based on the control signal, at least one of the first voltage on $V_{OUT}^+$ and the second voltage on $V_{OUT}^-$ such that the first and second voltages on $V_{OUT}^+$ and $V_{OUT}^-$, respectively, produce a predetermined comparator output.

10. The method of claim 9, further comprising:
    coupling $V_{IN}^+$ to $V_{IN}^-$ during an offset calibration mode of operation and disconnecting $V_{IN}^+$ from $V_{IN}^-$ during an amplification mode of operation, wherein the amplifier amplifies a voltage difference between $V_{IN}^+$ and $V_{IN}^-$ during the amplification mode of operation;
    coupling $V_{OUT}^+$ to a first input terminal of the comparator during the offset calibration mode of operation and disconnecting $V_{OUT}^+$ from the first input terminal of the comparator during the amplification mode of operation; and
    coupling $V_{OUT}^-$ to a second input terminal of the comparator during the offset calibration mode of operation and disconnecting $V_{OUT}^-$ from the second input terminal of the comparator during the amplification mode of operation.

11. The method of claim 9, wherein the comparator comprises a clocked comparator with an enable signal and wherein comparing comprises comparing the voltage on $V_{OUT}^+$ to the voltage on $V_{OUT}^-$ when the enable signal of the clocked comparator is activated.

12. The method of claim 9, wherein the adjusting comprises adjusting a first current associated with $V_{OUT}^+$ and a second current associated with $V_{OUT}^-$ based on the control signal.

13. The method of claim 12, wherein the adjusting the first and second currents comprises:
    adjusting, with a digital-to-analog converter (DAC), a first voltage applied to a first gate terminal of a first transistor; and
    adjusting, with the DAC, a second voltage applied to a second gate terminal of a second transistor, wherein the first and second transistors are configured to adjust the first and second currents, respectively.

14. A system to calibrate an offset in one or more amplifiers in a dual-residue analog-to-digital converter, comprising:
    a reference ladder;
    a first amplifier configured to receive an input voltage ($V_{IN}$) at a first positive differential input ($V_{IN1}^+$) and a first reference voltage ($V_{REF1}$) at a first a negative differential input ($V_{IN1}^-$) from the reference ladder and to produce a first positive differential output ($V_{OUT1}^+$) and a first negative differential output ($V_{OUT1}^-$);
    a second amplifier configured to receive $V_{IN}$ at a second positive differential input ($V_{IN2}^+$) and a second reference voltage ($V_{REF2}$) at a second a negative differential input ($V_{IN2}^-$) from the reference ladder and to produce a second positive differential output $V_{OUT2}^+$ and a second negative differential output $V_{OUT2}^-$; and an offset calibration circuit coupled to the first and second amplifiers, wherein the offset calibration circuit comprises:

a comparator configured to:
compare the voltage on $V_{OUT1}^+$ to the voltage on $V_{OUT1}^-$ when $V_{IN1}^+$ and $V_{IN1}^-$ are coupled to a first common voltage; and
compare the voltage on $V_{OUT2}^+$ to the voltage on $V_{OUT2}^-$ when $V_{IN2}^+$ and $V_{IN2}^-$ are coupled to a second common voltage;

a first voltage control unit configured to adjust a first voltage on $V_{OUT1}^+$ and a second voltage on $V_{OUT1}^-$;

a second voltage control unit configured to adjust a third voltage on $V_{OUT2}^+$ and a fourth voltage on $V_{OUT2}^-$; and a processing unit configured to:
provide a first control signal to the first voltage control unit based on the comparison of the voltages on $V_{OUT1}^+$ and $V_{OUT1}^-$, wherein the first voltage control unit adjusts, based on the first control signal, the first and second voltages on $V_{OUT1}^+$ and $V_{OUT1}^-$, respectively, to produce a first predetermined comparator output; and
provide a second control signal to the second voltage control unit based on the comparison of the voltages on $V_{OUT2}^+$ and $V_{OUT2}^-$, wherein the second voltage control unit adjusts, based on the second control signal, the third and fourth voltages on $V_{OUT2}^+$ and $V_{OUT2}^-$, respectively, to produce a second predetermined comparator output.

15. The system of claim 14, further comprising:

a first switch configured to couple $V_{IN1}^+$ to $V_{IN1}^-$ during a first phase of an offset calibration mode of operation and to disconnect $V_{IN1}^+$ from $V_{IN1}^-$ during an amplification mode of operation, wherein the first amplifier is configured to amplify a voltage difference between $V_{IN1}^+$ and $V_{IN1}^-$ during the amplification mode of operation;

a second switch configured to couple $V_{OUT1}^+$ to a first input terminal of the comparator during the first phase of the offset calibration mode of operation and to disconnect $V_{OUT1}^+$ from the first input terminal of the comparator during the amplification mode of operation;

a third switch configured to couple $V_{OUT1}^-$ to a second input terminal of the comparator during the first phase of the offset calibration mode of operation and to disconnect $V_{OUT1}^-$ from the second input terminal of the comparator during the amplification mode of operation;

a fourth switch configured to couple $V_{IN2}^+$ to $V_{IN2}^-$ during a second phase of an offset calibration mode of operation and to disconnect $V_{IN2}^+$ from $V_{IN2}^-$ during the amplification mode of operation;

a fifth switch configured to couple $V_{OUT2}^+$ to the first input terminal of the comparator during the second phase of the offset calibration mode of operation and to disconnect $V_{OUT2}^+$ from the first input terminal of the comparator during the amplification mode of operation; and a sixth switch configured to couple $V_{OUT2}^-$ to a second input terminal of the comparator during the second phase of the offset calibration mode of operation and to disconnect $V_{OUT2}^-$ from the second input terminal of the comparator during the amplification mode of operation.

16. The system of claim 14, wherein each of the first and second voltage control units comprises a digital-to-analog converter configured to receive the first and second control signals, respectively, from the processing unit and to adjust the first and second voltages applied to the first and second gate terminals, respectively, based on the control signal and to adjust a first current associated with $V_{OUT1}^+$ and a second current associated with $V_{OUT1}^-$ based on the first control signal and a third current associated with $V_{OUT2}^+$ and a fourth current associated with $V_{OUT2}^-$ based on the second control signal.

17. The system of claim 14, wherein the comparator comprises a clocked comparator.

18. The system of claim 14, wherein the clocked comparator is configured to receive an enable signal and, based on an activation of the enable signal, compare the first voltage on $V_{OUT1}^+$ to the second voltage on $V_{OUT1}^-$ and compare the third voltage on $V_{OUT2}^+$ to the fourth voltage on $V_{OUT2}^-$.

19. The system of claim 14, wherein the first amplifier comprises:

an input stage configured to receive $V_{IN1}^+$ and $V_{IN1}^-$; and an output stage comprising a first current path associated with $V_{OUT1}^+$ and a second current path associated with $V_{OUT1}^-$, wherein the first voltage control unit is configured to adjust at least one of the respective currents associated with the first and second current paths.

20. The system of claim 14, wherein the second amplifier comprises:

an input stage configured to receive $V_{IN2}^+$ and $V_{IN2}^-$; and an output stage comprising a first current path associated with $V_{OUT2}^+$ and a second current path associated with $V_{OUT2}^-$, wherein the second voltage control unit is configured to adjust at least one of the respective currents associated with the first and second current paths.

* * * * *